United States Patent
Owusu-Nkwantabisah et al.

(10) Patent No.: US 10,234,763 B2
(45) Date of Patent: Mar. 19, 2019

(54) METHOD OF PROVIDING PHOTOPATTERNED FUNCTIONAL SURFACES

(71) Applicant: Eastman Kodak Company, Rochester, NY (US)

(72) Inventors: Silas Owusu-Nkwantabisah, Brockport, NY (US); Roberta Dileo Benedict, Rochester, NY (US); David Y. Wang, Fairport, NY (US)

(73) Assignee: EASTMAN KODAK COMPANY, Rochester, NJ (US)

( * ) Notice: Subject to any disclaimer, the term of this patent is extended or adjusted under 35 U.S.C. 154(b) by 0 days.

(21) Appl. No.: 15/592,267

(22) Filed: May 11, 2017

(65) Prior Publication Data

US 2018/0329302 A1  Nov. 15, 2018

(51) Int. Cl.
*G03F 7/20* (2006.01)
*G03F 7/16* (2006.01)
*G03F 7/34* (2006.01)
*C23C 16/06* (2006.01)

(52) U.S. Cl.
CPC ............ *G03F 7/2022* (2013.01); *C23C 16/06* (2013.01); *G03F 7/16* (2013.01); *G03F 7/2002* (2013.01); *G03F 7/2051* (2013.01); *G03F 7/34* (2013.01)

(58) Field of Classification Search
CPC .................................. G03F 7/16; G03F 7/2022
See application file for complete search history.

(56) References Cited

U.S. PATENT DOCUMENTS

| | | | |
|---|---|---|---|
| 7,851,344 B2 | 12/2010 | Kugler et al. | |
| 8,936,890 B1 * | 1/2015 | Irving | G03F 7/038 427/304 |
| 9,224,600 B2 | 12/2015 | Ishihara et al. | |
| 2013/0040070 A1 | 2/2013 | Jung et al. | |
| 2015/0344652 A1 * | 12/2015 | Linxian | C08J 7/18 428/195.1 |

OTHER PUBLICATIONS

Andrew R. Davis and Kenneth R. Carter, "Surface Grafting of Vinyl-Functionalized Poly(fluorene)s via Thiol-Ene Click Chemistry," *Langmuir* 2014, 30, pp. 4427-4433.

* cited by examiner

*Primary Examiner* — Kathleen Duda
(74) *Attorney, Agent, or Firm* — J. Lanny Tucker

(57) ABSTRACT

An article is prepared with surface regions having different contact angles. A reactive silane material is attached to a surface having a reactive tail component that is contacted with a first corresponding reactant, followed by imagewise UV exposure to cause imagewise reaction of the reactive tail component and first corresponding reactant, forming reacted regions and latent reaction regions. After rinsing, a second corresponding reactant that is capable of reaction with the reactive moiety is applied. Uniform UV exposure leads to a second reaction product only in the latent reaction regions. After rinsing, first regions comprise exclusively the first reaction product and second regions comprising exclusively the second reaction product. These first and second regions have contact angles that differ by 10-110 degrees. A composition can be applied that is exclusively attracted to either the first regions or the second regions, but not to both the first and second regions.

13 Claims, 4 Drawing Sheets

US 10,234,763 B2

METHOD OF PROVIDING PHOTOPATTERNED FUNCTIONAL SURFACES

FIELD OF THE INVENTION

This invention relates to a method for providing a substrate with a surface having different chemical functionalities that are formed by photo-generated reaction of surface reactive moieties anchored to the substrate by a silane material, with different corresponding chemical reactants. The chemical reactants are chosen to provide a patterned surface having at least two distinct types of regions having contact angles that differ by a least 10°. Compositions ("inks") can be applied to at least one type of region in an exclusive manner.

BACKGROUND OF THE INVENTION

Surfaces are universal and are widely used in various contexts in daily living. The ability to control chemical or physical properties of a surface, such as hydrophobicity, antibacterial nature, antifouling nature, anti-icing property, and biocompatibility can be crucial in many applications. To introduce or modify a specific surface property has been the study in industry for decades and can be explored by incorporating selected elements or functional groups onto a surface. A classic example is the mussel-inspired polydopamine coating in which dopamine has been polymerized in basic aqueous solutions, resulting in a polydopamine coating on various surfaces immersed within the basic aqueous solutions. The polydopamine coating could, in turn, be reacted with thiols, amines, or metal ions to introduce further functionalities, offering a simple and versatile strategy for surface modification for many materials.

In such manner, it has been desired for some time to modify surfaces of a substrate such as a glass or polymeric materials so that they have various surface properties for industrial applications. For example, such a surface can be defined by the level of hydrophobicity or hydrophilicity depending upon the value of the water contact angle. A surface having a water contact angle that is greater than 90° is generally considered hydrophobic while a surface having a water contact angle less than 90° is generally considered hydrophilic. In practice, two types of water contact angle values can be considered: static and dynamic. Static water contact angles ($\theta_{st}$) are obtained by sessile drop measurements where a drop of water is deposited on the surface and the value is measured using a goniometer or specialized software. Dynamic contact angles are non-equilibrium contact angles and are measured both during the growth and shrinkage of a water droplet. The difference between these two measurements is defined as contact angle hysteresis.

U.S. Patent Application Publication 2015/0344652 (Linxian et al.) describes a method for modifying or producing super hydrophobic surfaces having a water contact angle greater than 150° that can be modified to produce surface patterns having different chemical functionalities, for example superhydrophilic-super hydrophobic surfaces for various industrial purposes. Such patterns can be generated using the known "click" chemical reactions that have been used and reviewed in various publications for several decades (for example, see summary Mostegel et al., *Journal of Materials Chemistry B*, 3(21), pp. 4431-4438, 2015; and Davis et al., *Langmuir* 30, 4427-4433, 2014; and references cited in both publications). However, surfaces that are merely hydrophobic and not superhydrophobic (a water contact angle less than 150° but greater than 90°) have not been described for producing dewetting patterns. Such a technique would be desirable because achieving superhydrophobicity often requires more process-intensive techniques and multi-step processing that includes both chemical and physical means of hydrophobicity, such as chemical repulsion and surface roughening.

U.S. Patent Application Publication 2013/0040070 (Jung et al.) describes a method for forming a microstructure pattern using double-dewetting edge lithography in which a photoresist pattern is formed on a hydrophilic substrate, followed by assembling a monolayer for example of a silane or thiol group, and multiple selective dewetting steps to leave a desired solute pattern.

U.S. Pat. No. 7,851,344 (Kugler et al.) describes the fabrication of microelectronic components by depositing electronically functional materials onto a substrate that possesses a wetting contrast. The wetting contrast areas are created by different plasma treatments of the substrate.

Despite the advances in the art in this technology, there is a need for further improvement. For example, there is a need for a means to provide fine lines in patterns in a rapid and consistent manner on highly transparent substrates. There is also a need to improve the adhesion of applied "inks" to either hydrophilic or hydrophobic regions so that the applied ink can be used for further operations without physical failures in either type of region. There is also a need for aligning patterns on both supporting surfaces of substrate (for example, planar objects).

SUMMARY OF THE INVENTION

The present invention provides a method for providing an article, the method comprising, in order:

providing an inert substrate having first and opposing second supporting surfaces, and the inert substrate having on the first supporting surface thereof, a reactive silane material comprising a head silane component covalently attached to the first supporting surface, and a reactive tail component comprising a reactive moiety selected from the group consisting of a thiol moiety, an ene moiety, an yne moiety, an azide moiety, and a tetrazolyl moiety;

forming a reactive surface by contacting the reactive silane material on the first supporting surface with a solution comprising a first corresponding reactant capable of reaction with the reactive moiety;

imagewise UV exposing the reactive surface to cause imagewise reaction of the reactive moiety with the first corresponding reactant, forming reacted regions and latent reaction regions on the reactive surface, the reacted regions comprising a first reaction product of the reactive moiety with the first corresponding reactant, the first reaction product being absent in the latent reaction regions on the reactive surface;

rinsing away non-reacted first corresponding reactant;

contacting the reactive surface having both reacted regions and latent reaction regions with a second corresponding reactant that is capable of reaction with the reactive moiety, and subsequently or simultaneously UV exposing the reactive surface to form a second reaction product of the reactive moiety with the second corresponding reactant only in the latent reaction regions;

rinsing away non-reacted second corresponding reactant to form a modified first supporting surface on the inert substrate, which modified first supporting surface has first regions comprising exclusively the first reaction product and second regions comprising exclusively the second reaction product, wherein the first and second regions have static contact angles that differ by at least 10 degrees and up to and including 110 degrees; and providing a composition on the modified first supporting surface, which composition is exclusively attracted to either the first regions or the second regions, but not to both the first and second regions, on the modified first supporting surface.

The present invention provides advantages including its use in light transmission controllers, patterned conductive traces, and master pattern transfer. The present invention obviates the need for superhydrophobic surfaces in dewetting patterns. The present invention allows for production of patterned hydrophilic/hydrophobic surfaces as well as subsequent surface inking with suitable compositions that are attracted to certain regions in the surfaces in a continuous process.

DETAILED DESCRIPTION OF THE INVENTION

Figure 1:
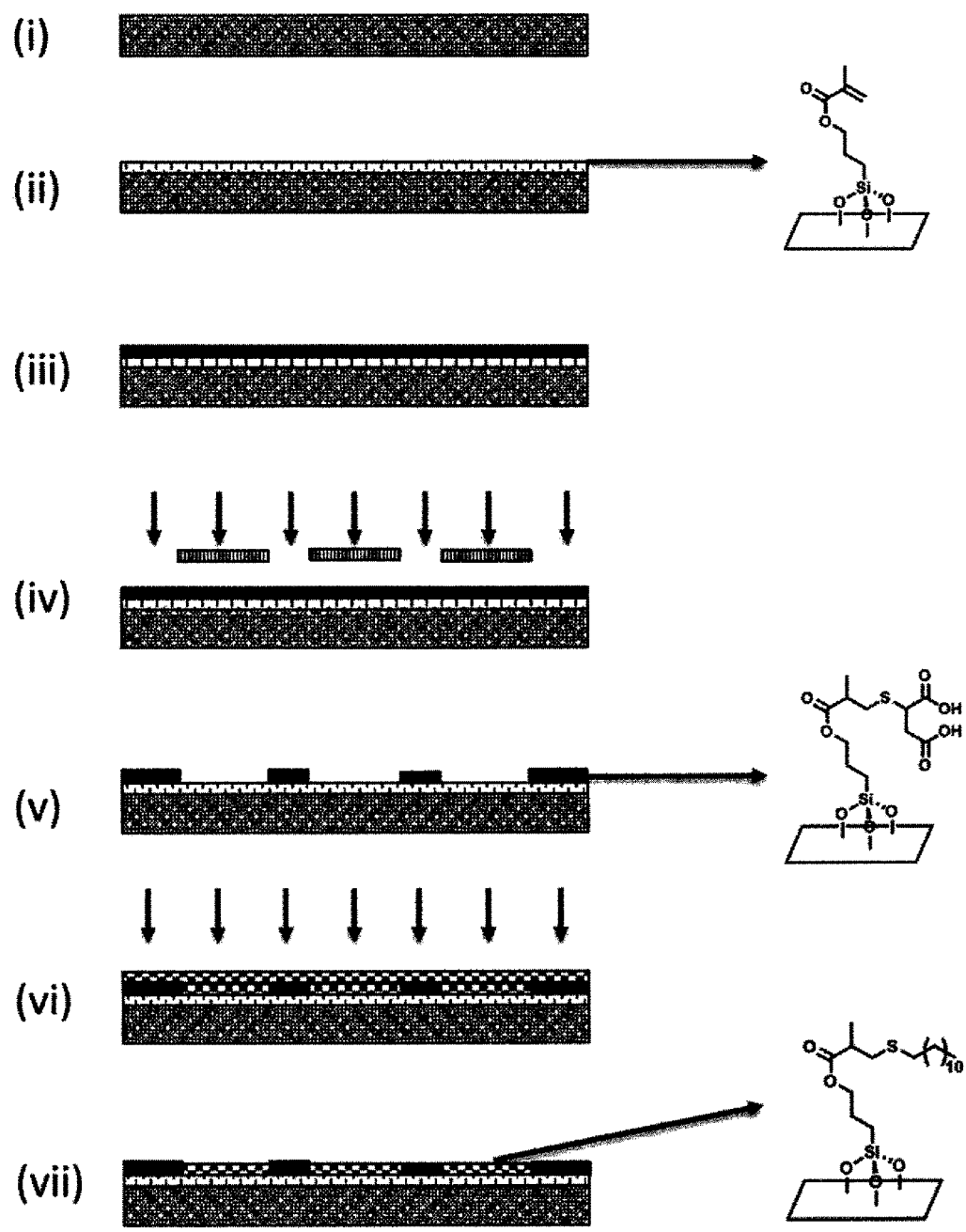
FIG. 1 is a schematic illustration of the sequence of steps in some embodiments of the method of the present invention, to obtain chemically patterned surfaces of hydrophilic and hydrophobic regions, and examples of useful chemical structures, for example as exemplified in Invention Example 1 below.

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described for the discussion of any embodiment.

Definitions

As used herein to define various components of the reactive silane materials, the first and second corresponding reactants and other materials used in the practice of this invention, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term should be interpreted to have a standard dictionary meaning.

The use of numerical values in the various ranges specified herein, unless otherwise expressly indicated, are considered approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

Water contact angles described herein are meant to refer to "static" contact angles ($\theta_{st}$) that are obtained by sessile water drop measurements using a goniometer and standard procedures.

The term "first supporting surface" and "opposing second supporting surface" are not meant to designate a preference in supporting surfaces in an inert substrate, but to merely distinguish between a "modified" or treated supporting surface and an opposing supporting surface that may not be modified or treated.

Method for Providing Article with Modified Supporting Surface

Articles with one or more modified supporting surfaces are provided generally in the following manner:

A suitable inert substrate (defined below) is provided, which inert substrate generally has first and opposing second supporting surfaces. One or both of such supporting surfaces can be used in the method of the present invention. However, in most embodiments, only a single (or first) supporting surface is to be used or modified. This feature is illustrated as (i) in FIG. 1. The process for modifying the first supporting surface begins by providing a reactive silane material on that first supporting surface in a uniform manner (that is, the reactive silane material is not purposely present in a patternwise fashion), and a representative process for doing this is described below. Alternatively, the inert substrate can be provided with the reactive silane material already in place on the supporting surface. In each embodiment, a silane-containing compound is attached, usually covalently, to the first supporting surface. Further details of useful organosilanes used to provide reactive silane materials are shown below. This feature is illustrated as (ii) in FIG. 1, for example in which the organosilane, 3-(trimethoxysilyl)propyl methacrylate (as shown in Invention Example 1) has been used to form a reactive silane material on the first supporting surface.

Once the reactive silane material is available (thus, a silanated or silanized supporting surface is available), it is uniformly contacted with a first corresponding reactant that is capable of reacting with a reactive moiety of the reactive silane material (described below) wherein the first supporting surface becomes a reactive surface. This feature is illustrated as (iii) in FIG. 1.

This reactive surface can be exposed to ultraviolet (UV) radiation under conditions (described below) such that exposure occurs in an imagewise fashion, for example, through a suitable mask or masking element, as illustrated in feature (iv) of FIG. 1. In some embodiments, forming the reactive surface and imagewise UV exposing the reactive surface can be carried out sequentially. The imagewise UV exposure generates reacted regions in which the first corresponding reactant has reacted with a reactive moiety of the reactive silane material to produce a first reaction product, and latent reaction regions on the reactive surface that are shielded from UV exposure. Thus, no first reaction product is purposely formed in the latent reaction regions by means of the UV exposure. This feature is illustrated in (v) of FIG. 1 for example, in which mercaptosuccinic acid is reacted with the reactive moiety of the reactive silane material (attached 3-(trimethoxysilyl)propyl methacrylate as shown in Invention Example 1).

Excess or unreacted first corresponding reactant is then rinsed away.

The reactive surface is then uniformly contacted with a second corresponding reactant that is capable of reaction with the reactive moiety of the reactive silane material, and subsequently or simultaneously with this contact, the reactive surface is uniformly (blanketwise) exposed to UV radiation under conditions described below. This causes a reaction of the second corresponding reactant and the reactive silane material to form a second reaction product in the latent reaction regions only. No further reaction occurs in the reacted regions of the first supporting surface. This feature is illustrated in (vi) of FIG. 1.

Non-reacted second corresponding reactant can then be rinsed away, leaving a modified first supporting surface with first regions comprising exclusively the first reaction product and the second regions comprising exclusively the second reaction product. Thus, the modified first supporting surface has both hydrophilic regions and hydrophobic regions on the inert substrate. Such feature is illustrated in (vii) of FIG. 1, showing the second reaction product on the first supporting surface (for example, attached reaction product of dodecanethiol with the silane reaction product in Invention Example 1).

An essential feature is that at this point in the method of the present invention, the static (water) contact angles of the first regions and the second regions differ by at least 10 degrees and up to and including 110 degrees, or by at least 30 degrees and up to and including 80 degrees, or even by at least 35 degrees and up to and including 75 degrees. Such static contact angles can be determined as described above.

Once the first and second regions can be formed and differentiated by contact angle, a suitable composition (described in detail below) can provided uniformly on the modified first supporting surface, which composition is exclusively attracted to or "wets" either the first regions or the second regions, but not to both first and second regions. This can provide an article having a clear patternwise discrimination of the physical properties as exhibited by the presence or absence of the composition on the first supporting surface.

Further details will now be provided for various features and materials used to carry out the present invention.

Inert Substrates:

The present invention is carried out using a suitable inert substrate. By "inert", it is meant that the substrate generally is not capable of chemical reaction with any of the first or second corresponding reactants (described below) to any appreciable extent, but such inert substrate is capable of being silanized using a suitable organosilane as described below. In general, such inert substrates have surface reactive groups such as hydroxy groups that can be reacted with one or more suitable organosilanes as described below. These surface reactive groups can be inherent in the inert substrate material or they can be added to a substrate material using known surface treatments.

Examples of useful substrate materials include but are not limited to, silicate and borosilicate glass, metals (such as titanium, nickel, aluminum, copper, brass, and bronze), metal oxides (such as aluminum oxide, zinc oxide, aluminum-doped zinc oxide, and titanium dioxide), polymers (such as polystyrenes, polyethylene terephthalate (PET), polyacrylonitrile, polyethylene naphthalate (PEN), cellulose acetate, cellulose triacetate, cellulose diacetate, polyvinylidene fluoride, and polyvinyl alcohol), wood (such as plywood), fabrics (both woven naturally-occurring and synthetic materials, and polydimethylsiloxane. Particularly useful inert substrates include rigid or flexible glasses such as those commercially available as Corning® Willow® Glass and Corning® Gorilla® Glass from Corning Incorporated.

It is also useful for many embodiments that the inert substrate is transparent, meaning that it transmits at least 80% and even at least 90% of impinging electromagnetic radiation in the visible region (that is, from about 450 nm and up to and including 800 nm).

Reactive Silane Materials:

As noted above, reactive silane materials are provided on at least one supporting surface of an inert substrate. Such reactive silane materials generally comprise a "head" silane component that is attached directly to (or covalently immobilized on) the supporting surface and a reactive "tail" component as described below in more detail. Such reactive silane materials generally can be derived from suitable organosilanes having at least one —Si—C bond and represented by the following Structure (I):

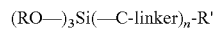

wherein the three R groups can be the same or different hydrolyzable groups such as alkoxy each having 1 to 4 carbon atoms (such as methoxy, ethoxy, isopropoxy, n-butoxy, and t-butoxy) or acetoxy groups; C-linker represents a linking group having a carbon atom directly attached to the silicon atom, including but not limited to a hydrocarbon linking group; R' represents a suitable reactive tail component; and "n" is 0 or 1. Thus, the (RO—)$_3$ moiety in Structure (I) represents the head silane component to be attached to the supporting surface. In many embodiments, R represents the same alkoxy groups in the molecule, such as three methoxy or three ethoxy groups, "n" is 1, and C-linker represents a hydrocarbon having 1 to 6 carbon atoms, or more typically, 2 to 4 carbon atoms in the chain.

Useful reactive tail components (R') include reactive moieties that are capable of reacting with a first or second corresponding reactant described below. For example, R' can include an ene moiety (such as a vinyl or ethenyl moiety, —CH=CH$_2$), a primary amino moiety (—NH$_2$), an yne moiety (such as an ethynyl or ethinyl moiety, —C≡CH), a thiol moiety (—SH), a tetrazolyl moiety

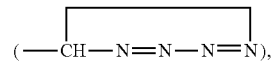

an epoxy moiety, or a selenol moiety (—SeH). The ene, yne, and thiol moieties are particularly useful as reactive tail components.

Useful organosilanes within Structure (I) can be obtained from various commercial sources or prepared using known synthetic methods and starting materials. For example, useful organosilanes are as follows:

Ene Moiety:
3-(trimethoxysilyl)propyl methacrylate;
vinyltrimethoxysilane; and
3-(trimethoxysilyl)propyl acrylate.

Yne Moiety:
trimethoxy-4-pentyn-1-yl-silane; and
triethoxy-4-pentyn-1-yl-silane.

Thiol Moiety:
(3-mercaptopropyl)trimethoxysilane;
(2-Mercaptoethyl)triethoxysilane;

(3-Mercaptopropyl)triethoxysilane;
(2-Mercaptoethyl)trimethoxysilane;
(2-Mercaptoethyl)tripropoxysilane; and
(3-mercaptopropyl)tri-t-butoxysilane.

Tetrazolyl Moiety:
3-(trimethoxysilyl)propyl 4-(2-phenyltetrazol-5-yl)benzoate; and
(2-oxo-2-(4-((4-(2-phenyltetrazol-5-yl)benzoyl)oxy)butoxy)-ethyl)phosphonic acid Azide Moiety:
3-(trimethoxysilyl)propyl 4-azide-2,3,5,6-tetrafluorobenzoate.

The reactive silane material can be formed on a supporting surface using known silanation conditions, namely contacting the supporting surface having reactive surface hydroxy groups with an organosilane as defined above for a suitable time and at a suitable temperature to hydrolyze the head silane component of the organosilane and covalently bond it to the supporting surface. It is intended to leave the reactive tail component extended outwardly from the supporting surface and thus free for future reaction. An organosilane used to provide the reactive silane material can be applied to the supporting surface in any suitable manner, including various coating techniques, to provide an essentially uniform coating. The coating weight is generally uniform although there can be variations depending upon the means for application. The reactive silane material is generally supplied in 0.1 to 20 weight % solution in a medium that generally comprises organic solvents and optionally a small amount of water (less than 40 weight % of total solvent medium). The solvent medium is usually designed by a manufacturer to fully dissolve the reactive silane material.

Suitable time for the silanation to occur will depend upon the temperature and type of head silane component being used but it can generally be for at least 1 minute at a temperature of from 20° C. and up to and including 100° C. Time and temperature conditions can be optimized by one skilled in the art to facilitate uniform attachment of the reactive silane material without degradation or other adverse effects that would inhibit the reaction of the reactive tail component of the reactive silane material with either first or second corresponding reactant. Representative conditions for formation of a reactive silane material are illustrated in Invention Examples 1 and 2 below.

The reactive silane material can also be formed from organosilane precursors deposited on the supporting surface that upon subsequent reactions with other compounds form a surface with specific reactive tail components as described below. An example of such an organosilane precursor is γ-glycidoxypropyltrimethoxysilane that upon reacting with a subsequent component such as allyl amine, yields the reactive silanized surface with pendant ene reactive tail components.

First and Second Corresponding Reactants:

First and second corresponding reactants are chosen in a given embodiment of the present invention to be reactive with the specific reactive tail component that is available for reaction on the supporting surface. The first and second corresponding reactants are not used simultaneously but in sequence using the method protocol described above and illustrated in FIG. 1. Each type of corresponding reactant is chosen or designed for the required reaction, but upon reaction, they also become attached to (or immobilized on) the supporting surface using the reactive silane material as a "linking" material. Each of the corresponding reactants is also designed or chosen to provide either hydrophilic or hydrophobic character to the region of the supporting surface to which they become attached.

For example, the first corresponding reactant can be chosen (due to designed chemical composition) to provide higher hydrophilicity in the regions (for example, "first" regions) to which they are attached compared to other regions (for example, "second" regions) of the supporting surface. In contrast, a second corresponding reactant used after the reaction of the first corresponding reactant can then be chosen (due to designed chemical composition) to provide higher hydrophobicity in second regions of the supporting substrate. In each case, both the first and second corresponding reactants are capable of reacting with the reactive tail components of the reactive silane material, in the respective regions. The result is a pattern of different hydrophobic and hydrophilic regions on the supporting surface useful for purposes described herein.

Alternatively, the sequence of reactions can be reversed, and hydrophobic "first" regions can be created followed by the creation of hydrophilic "second" regions, by judicious choice of first and second corresponding reactants having the appropriate chemical compositions.

In some embodiments, the reactive moiety is an ene moiety, and the first corresponding reactant is a thiol moiety, and the second corresponding reactant is a thiol moiety or a tetrazole moiety.

The following table shows possible reactive moieties in first and second corresponding reactants suitable for "click" chemical reaction with each type of reactive moiety in the reactive tail component.

| Reactive Tail Component | Possible First & Second Corresponding Reactant Moieties |
| --- | --- |
| ene moiety | thiol moiety, tetrazolyl moiety |
| yne moiety | thiol moiety, tetrazolyl moiety |
| azide moiety | ene moiety, yne moiety |
| tetrazolyl moiety | ene moiety, yne moiety |
| thiol moiety | ene moiety, yne moiety |

Reaction of a first or second corresponding reactant in the respective steps according to the present invention can be carried out under suitable conditions (time, temperature, reactant concentration) such that predominantly all (more than 80 mol %) of the available reactive tail component in the respective regions on the supporting surface participate in chemical reaction. Each first and second corresponding reactant generally is supplied in pure form or as a solution in an appropriate solvent medium such as ethanol, and can be obtained from various commercial sources or prepared using known starting materials and synthetic methods.

Representative first and second corresponding reactants comprising a thiol moiety include but are not limited to, various mercapto compounds such as mercaptosuccinic acid, mercaptopropionic acid, thioglycolic acid, mercaptobutyric acid, cysteine, cysteamine, and thioglycerol to provide hydrophilic regions; and dodecanethiol, octanethiol, octadecanethiol, and 1H, 1H, 2H, 2H-perfluorodecanethiol to provide hydrophobic regions.

Representative first and second corresponding reactants comprising an ene moiety include but are not limited to, various (meth)acrylic acids or (meth)acrylic acid esters wherein the (meth)acrylic acids such as methacrylic acid can provide hydrophilic regions; and the (meth)acrylic acid esters such as stearyl methacrylate can provide hydrophobic regions. Other materials include hydrocarbon-, hydrofluorocarbon-, and fluorocarbonalkenes and their derivatives such as 1-pentene, 1-hexene, and 1-octene. Still other materials include maleic anhydride and maleic acid.

Representative first and second corresponding reactants comprising an yne moiety include but are not limited to, various aliphatic and aryl alkynes such as 1-pentyne, 1-hexyne, 1-octyne, 1-ethynylbenzene, 1-ethynyl-4-methylbenzene, 1-ethynyl-4-ethylbenzene, and any substitution off ethynylbenzene given a haloarene precursor.

Representative first and second corresponding reactants comprising an azide moiety include but are not limited to, various tetrafluoroarylazide compounds such as 3-azido-1,2,4,5-tetrafluorobenzene, 1-azido-2,3,5,6-tetrafluoro-4-methylbenzene, and 1-azido-2,3,5,6-tetrafluoro-4-ethylbenzene.

Representative first and second corresponding reactants comprising an tetrazole moiety include but are not limited to, various diaryltetrazole compounds such as 2,5-diphenyltetrazole, 4-(2-phenyltetrazolyl)benzoic acid, and methyl 4-(2-phenyltetrazolyl)benzoic acid.

Representative first and second corresponding reactants are described in Invention Examples 1 and 2 below.

The first corresponding reactant can be supplied to the reactive silane material in any suitable manner, for example, using a coating technique, spraying, or any depositing process. Typically, the first corresponding reactant is uniformly spread on the first supporting surface to which the reactive silane material is attached. The amount of supplied first corresponding reactant is not critical, but generally, enough is used to cover the entire supporting surface without wasting excess material.

First UV Exposure and Masking Elements:

Once the reactive surface is provided as described above, imagewise exposure to ultraviolet (UV) radiation can be carried out sequentially to cause imagewise reaction of the reactive moiety on the reactive surface with the provided first corresponding reactant, forming a first reaction product in reacted regions (regions where "click" chemistry occurs between the two reactive materials) and latent reaction regions on the reactive surface where no first reaction product exists (or at least no appreciable reaction product exists).

UV radiation exposure can be carried out using suitable irradiation equipment for a sufficient time and with sufficient energy to obtain first reaction product using at least 90 mol % of the reactive moiety in the irradiated regions. For example, UV radiation exposure can be carried out using a Newport-I series equipment (UVA Packaging) for a suitable time to provide a desirable dosage of at least 0.5 mW/cm$^2$ and up to and including 30 mW/cm$^2$.

Imagewise UV exposure can be carried out using a suitable "mask" or masking element that is specifically designed for the pattern to be formed on the supporting surface of the substrate. A mask can be formed by depositing a metal film on a glass or quartz substrate using vacuum evaporation or sputtering techniques. Metals commonly used, include but are not limited to, chrome, aluminum, silicon-molybdenum, and iron oxides. The metals can be etched in a corresponding desired pattern. Conventional photoresist methods can be applied to create a pattern during metal deposition, followed by the removal of the resist to result in the desired mask pattern. In addition to photomasks, shadow masks could also provide the necessary patterning for the first exposure step.

A variety of masking elements can be obtained commercially or designed by commercial vendors for a given product. For example, photomasks and shadow masks can be designed and purchased from companies such as Toppan, Heidelberg Instruments, and HTA photomask, and others that specialize in mask design and manufacture.

It is also possible to use the "mask-forming films" described in U.S. Patent Application Publication 2005/00227182 (Ali et al.) and U.S. Pat. No. 7,799,504 (Zwadlo et al.), the disclosures of both of which are incorporated herein by reference with respect to masking elements. Such mask-forming films can comprise a non-silver halide thermally-sensitive imageable layer on transparent carrier sheet, and while such materials are generally used to make flexographic relief images and printing elements, they can be used as masks in other applications including the present invention.

The masking element can be arranged on the supporting surface (first supporting surface) of the inert substrate from which exposing UV radiation is directed, or the masking element arranged on and imagewise exposing radiation can be directed from an opposing second supporting surface ("backside") of the inert substrate.

Imagewise UV exposure can also be carried out using a "maskless" imagewise exposure technique, such as direct laser writing. This approach can provide very fine features and eliminate the time and costs associated with producing a suitable masking element. Maskless photolithography techniques for creating patterns on objects are described in U.S. Pat. No. 5,870,176 (Sweatt et al.); U.S. Pat. No. 6,060,224 (Sweatt et al.); U.S. Pat. No. 6,177,980 (Johnson); U.S. Pat. No. 6,251,550 (Ishikawa); and U.S. Pat. No. 6,998,219 (Fries), the disclosures of all of which are incorporated herein by reference.

Rinsing Conditions:

Once the first reaction product has been formed in the reacted regions, to prevent unwanted reaction in the latent reaction regions, any unreacted first corresponding reactant is quickly washed away from the first supporting surface in a "first" rinsing operation, using any suitable solution that will not adversely affect any materials immobilized on the first supporting surface. In general, rinsing fluids comprise water, an alcohol, acetone, or a mixture thereof, in which the first corresponding reactant is either soluble or dispersible. The rinsing fluid can be flowed over the first supporting surface, sprayed thereon, or otherwise applied in any convenient manner.

Rinsing is typically carried out at ambient temperature but the rinsing fluid can also be gently warmed to facilitate removal of the unreacted first corresponding reactant.

While this discussion has been focused on the first rinsing operation after the imagewise UV exposure, the same or different rinsing fluids and conditions can be used in a "second" rinsing operation after contact with the second corresponding reactant and the second UV exposure described below to remove unreacted second corresponding reactant.

Second UV Exposure:

After the noted "first" rinsing, the reactive surface can be contacted with a second corresponding reactant that is chosen to provide the desired surface properties upon formation of the second reaction product with the reactive moiety in the latent reaction regions.

The second corresponding reactant can be supplied in any suitable manner, for example, using a coating technique, spraying, or deposition processes. Typically, the second corresponding reactant is uniformly spread on the first supporting surface to which the reactive silane material is attached in the latent reactive regions. The amount of supplied second corresponding reactant is not critical, but generally, enough is used to cover the entire supporting surface without wasting excess material.

Once the second corresponding reactant is supplied, the entire supporting surface is uniformly exposed to UV radiation (that is, no masking element is used). Conditions and equipment useful for this blanketwise UV exposure can be same or different from those described above for the first UV exposure through a masking element or by using a maskless patternwise exposure. For example, the uniform exposure can be directed to the supporting surface having the second reaction product, or it can be directed from the "backside" (opposing second supporting surface).

A "second" rinsing operation is then carried out similarly to the first rinsing operation to remove unreacted second corresponding reactant, and using a rinsing fluid as described above.

At this point, there are two different regions (first and second regions) having different surface characteristics so the contact angle difference between the first and second regions are as defined above, that is, differing by at least 10 degrees and up to and including 110 degrees. Thus, the supporting surface has been modified according to the present invention to have both hydrophilic and hydrophobic regions on the inert substrate.

Compositions to be Applied:

Once the first and second regions are formed in the modified first surface, the resulting article is now ready for various uses, including the application of a suitable composition. This composition is exclusively attracted to either the first regions or the second regions, depending upon whether the composition is attracted to hydrophilic or hydrophobic sites in the noted regions. The composition is chosen such that it is not exclusively attached to both the first and second regions on the modified first supporting surface.

In some embodiments, the composition can be chosen or designed to be attracted to the hydrophilic regions. For example, this is shown below in Invention Examples 1 and 2 in which composition comprising silver nanoparticles is attracted to the hydrophilic regions on the modified supporting surface. Other examples of compositions that can be used in this manner and are attracted to the hydrophilic regions include but are not limited to, aqueous titanium dioxide dispersions, metal nanoparticle colloids, and aqueous dye-based inks. Most compositions that are aqueous in nature with a "sufficiently small" particle or additive will be attracted to the hydrophilic regions. In these embodiments, "sufficiently small" refers to particles, molecules, or additives being smaller than the dimensions of the features of the image pattern to which the composition would be attracted.

Alternatively, the composition can be designed or chosen to be attracted to the hydrophobic regions. For example, such composition can be oleophilic dispersions or organic-solvent based inks.

In general, the compositions chosen for this aspect of the present invention can have various chemical purposes, composition, optical density, and viscosity. However, in many embodiments, the composition provided on the modified first supporting has a viscosity of at least 1 centipoise (0.001 Pascal sec) and up to and including 300 centipoise (0.3 Pascal sec). The viscosity can be adjusted or chosen for a given end use of the composition and what is ultimately done with it on the modified first supporting surface.

It can also be important in many embodiments that the composition is provided on the modified support surface in a specific coverage no matter how it is applied, for example of at least 5 g/m$^2$ and up to and including 200 g/m$^2$.

Additional Operations:

The resulting article having the composition arranged in the appropriate regions on the modified first supporting surface can be used for various additional operations. For example, when the composition is provided on the modified first supporting surface in a patter, the method can further comprise:

patternwise transferring the composition from the modified first supporting surface to a receiver material (of any type that would readily be available to one skilled in the art), to form an imaged pattern corresponding to either the first regions or the second regions, but not to both the first and second regions, on the receiver material. Such operations could be used to in a printing application such as flexography or to realize the imaged pattern on a substrate that is not conducive to "click" chemistry as that term is known in the art.

If the composition comprises seed metal catalysts as those materials are known in the art, the composition residing on either the hydrophilic or hydrophobic regions of the modified first supporting surface can be electrolessly plated using compositions and procedures that are known in the art.

The present invention provides at least the following embodiments and combinations thereof, but other combinations of features are considered to be within the present invention as a skilled artisan would appreciate from the teaching of this disclosure:

1. A method for providing an article, the method comprising, in order:

providing an inert substrate having first and opposing second supporting surfaces, and the inert substrate having on the first supporting surface thereof, a reactive silane material comprising a head silane component attached to the first supporting surface, and a reactive tail component comprising a reactive moiety selected from the group consisting of a thiol moiety, an ene moiety, an yne moiety, an azide moiety, and a tetrazolyl moiety;

forming a reactive surface by contacting the reactive silane material on the first supporting surface with a solution comprising a first corresponding reactant capable of reaction with the reactive moiety;

imagewise UV exposing the reactive surface to cause imagewise reaction of the reactive moiety with the first corresponding reactant, forming reacted regions and latent reaction regions on the reactive surface, the reacted regions comprising a first reaction product of the reactive moiety with the first corresponding reactant, the first reaction product being absent in the latent reaction regions on the reactive surface;

rinsing away non-reacted first corresponding reactant;

contacting the reactive surface having both reacted regions and latent reaction regions with a second corresponding reactant that is capable of reaction with the reactive moiety, and subsequently or simultaneously UV exposing the reactive surface to form a second reaction product of the reactive moiety with the second corresponding reactant only in the latent reaction regions;

rinsing away non-reacted second corresponding reactant to form a modified first supporting surface on the inert substrate, which modified first supporting surface has first regions comprising exclusively the first reaction product and second regions comprising exclusively the second reaction product, wherein the first and second regions have static contact angles that differ by at least 10 degrees and up to and including 110 degrees; and providing a composition on the modified first supporting surface, which composition is exclusively attracted to either the first regions or the second regions, but not to both the first and second regions, on the modified first supporting surface.

2. The method of embodiment 1, wherein the first and second regions have static contact angles that differ by at least 30 degrees and up to and including 80 degrees.

3. The method of embodiment 1 or 2, wherein the first and second regions have static contact angles that differ by at least 35 degrees and up to and including 75 degrees.

4. The method of any of embodiments 1 to 3, wherein the reactive moiety is an ene moiety, and the first corresponding reactant is a thiol moiety, and the second corresponding reactant is a thiol moiety or a tetrazole moiety.

5. The method of any of embodiments 1 to 4, wherein the composition comprises seed metal catalysts, and the method further comprises electrolessly plating the composition on the modified first supporting surface.

6. The method of any of embodiments 1 to 5, wherein the composition is provided on the modified first supporting surface in a pattern, and the method further comprises:

patternwise transferring the composition from the modified first supporting surface to a receiver material, to form an imaged pattern corresponding to either the first regions or the second regions, but not to both the first and second regions, on the receiver material.

7. The method of any of embodiments 1 to 6, wherein the composition provided on the modified first supporting surface has a viscosity of at least 1 centipoise (0.001 Pascal sec) and up to and including 300 centipoise (0.3 Pascal sec).

8. The method of any of embodiments 1 to 7, wherein the composition is provided on the modified first supporting surface at a coverage of at least 5 $g/m^2$ and up to and including 200 $g/m^2$.

9. The method of any of embodiments 1 to 8, wherein the inert substrate comprises a flexible glass.

10. The method of any of embodiments 1 to 9, wherein forming the reactive surface and imagewise UV exposing the reactive surface are carried out sequentially.

11. The method of any of embodiments 1 to 10, for providing the modified first supporting surface having hydrophilic regions and hydrophobic regions on the inert substrate.

12. The method of any of embodiments 1 to 11, wherein the inert substrate is transparent.

13. The method of embodiment 12, wherein the imagewise UV exposing is carried out through the opposing second supporting surface of the inert substrate.

The following Examples are provided to illustrate the practice of this invention and are not meant to be limiting in any manner.

Invention Example 1: Article with Hydrophilic-Hydrophobic Pattern with Applied Silver Nanoparticle Composition A supporting surface of a 75×50 mm micro-slide (obtained from Corning Glass Company) was treated by spreading a 10 weight % potassium hydroxide solution uniformly on the supporting surface of the micro-slide and left for 5 minutes, followed by rinsing with deionized water and then with isopropyl alcohol (IPA). After nitrogen drying the treated micro-slide, 0.5 ml of a silane solution was uniformly deposited on the treated micro-slide supporting surface. This silane solution comprised 10 weight % of 3-(trimethoxysilyl)propyl methacrylate (TMSPM, obtained from Sigma-Aldrich Company) in a mixture of ethanol and deionized water in a 1:1 molar ratio. After 1 minute of supporting surface contact with the TMSPM solution, the micro-slide was spun at 2500 rpm for 30 seconds, followed by annealing at 65° C. for 10 minutes, rinsing with IPA, and drying with nitrogen to obtain a silanized supporting surface on the micro-slide. These actions are illustrated for example in (i) and (ii) of FIG. 1.

An ethanol solution of 15 weight % of mercaptosuccinic acid (MSA, obtained from Fluka) was used for providing hydrophilic areas on the silanized supporting surface. Dodecanethiol (DDT, from Aldrich) was used for providing the hydrophobic areas on the silanized supporting surface in the following manner.

To achieve a chemically patterned surface having both hydrophilic and hydrophobic regions on the supporting surface, a 0.5 ml of the MSA solution was uniformly spread on the silanized supporting surface, followed by exposing to ultraviolet (UV) radiation through a mask using a Newport accessory having a 260-320 nm filter. The micro-slide was then rinsed with IPA to remove unreacted MSA and air-dried at ambient temperature. In the above UV exposure, it was assumed that the MSA hydrophilic reactants were exclusive to the unmasked regions (for example, see FIG. 1, (iii) through (v)).

The micro-slide was then subjected to a mask-free (uniform or blanket) UV exposure (using the 260-320 nm filter) after uniformly spreading of 0.5 ml of the DDT reagent on the entire supporting surface, followed by rinsing with acetone, and air-drying at ambient temperature to provide a modifier supporting surface with hydrophilic and hydrophobic regions, respectively (see FIG. 1, (vi) and (vii)).

It was determined that the static contact angle difference between the hydrophilic regions and hydrophobic regions was 61°.

A dispersion ("composition") of silver nanoparticles at 70 weight % was coated onto the modified supporting surface of the micro-slide (article) using a #2 rod that provided a wet laydown of 5-10 µm of this composition. The following TABLE I shows the wet laydown of solutions for the different rod numbers that were used to obtain the various composition coatings. The composition spontaneously wetted the hydrophilic regions to produce a pattern of the composition.

TABLE I

| Rod Number | Wet Laydown (µm) |
|---|---|
| 2 | 5 |
| 3 | 7.5 |
| 4 | 10 |

Figure 2:
FIG. 2 shows a pattern of straight lines as described below for Invention Example 1 wherein (i) represents hydrophobic regions containing no silver nanoparticles and (ii) represents hydrophilic regions containing silver nanoparticles.
Figure 3:
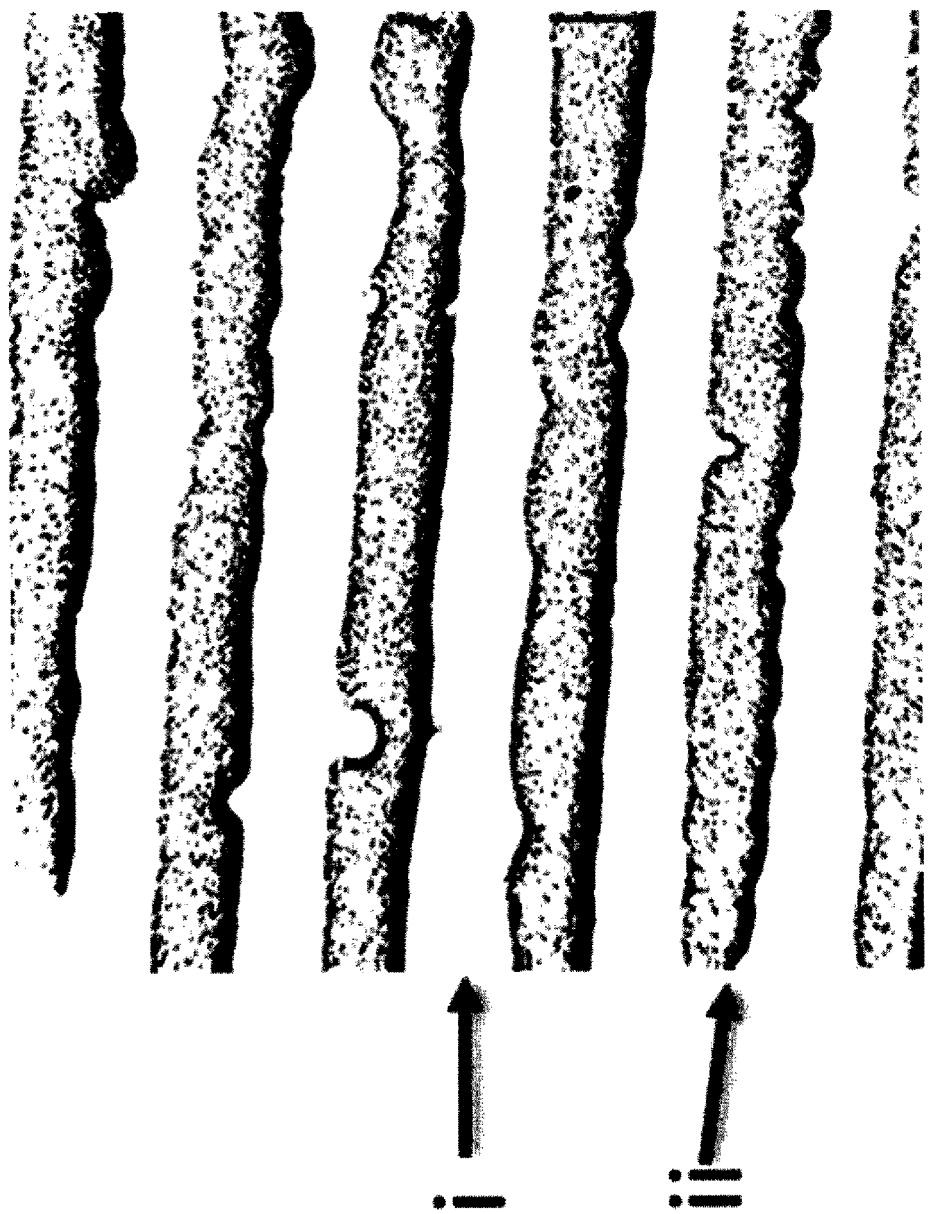
FIG. 3 shows a pattern of straight lines as described below for Invention Example 1 wherein (i) represents hydrophobic regions containing no silver nanoparticles and (ii) represents hydrophilic regions containing silver nanoparticles.
Figure 4:
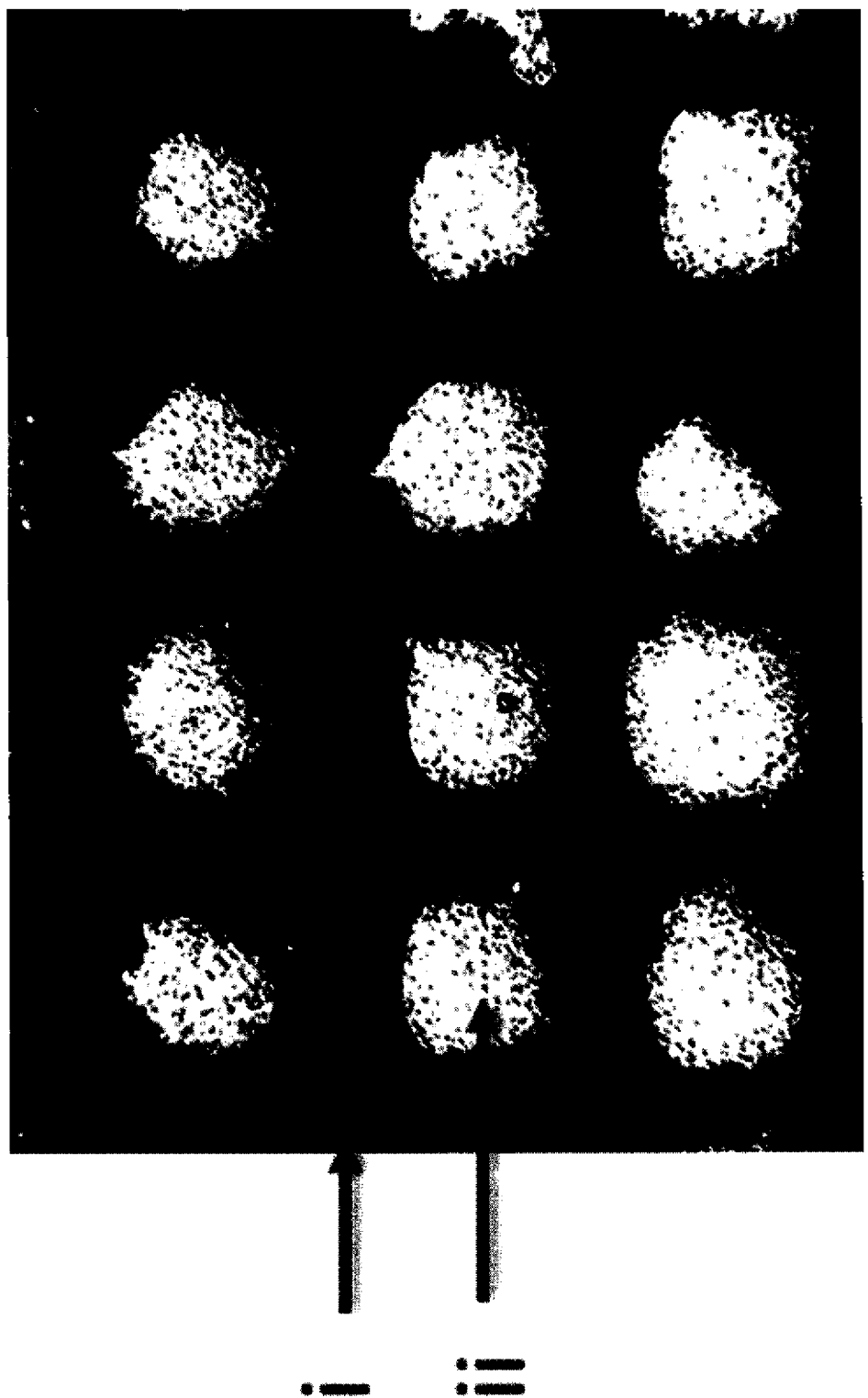
FIG. 4 shows a pattern of circles as described below for Invention Example 1 wherein (i) represents hydrophobic regions containing no silver nanoparticles and (ii) represents hydrophilic regions containing silver nanoparticles.

FIGS. 2-4 shows three articles prepared according to this Example having different patterned coatings of silver nanoparticle dispersion (composition) on the modified supporting surface of the micro-slide as described above. Thus, in FIG. 2, patterned coatings of silver nanoparticle dispersions on the chemically patterned micro-slides where hydrophilic regions containing the silver composition are 15 µm and hydrophobic regions containing no silver are about 120 µm. In FIG. 3, patterned coatings of silver nanoparticle dispersions on the chemically patterned micro-slides where hydrophilic regions containing silver composition are about 79 µm and hydrophobic regions containing no silver are about 58 µm. In FIG. 4, patterned coatings of silver nanoparticle dispersions on the chemically patterned micro-slides where the hydrophilic regions containing silver are non-symmetrical geometric shapes.

Invention Example 2: Article with Hydrophilic-Hydrophobic Pattern with Applied Silver Nanoparticle Composition A supporting surface of a 75×50 mm micro-slide (obtained from Corning Glass Company) was treated by spreading a 10 weight % potassium hydroxide solution uniformly on the supporting surface of the micro-slide and left for 5 minutes, followed by rinsing with deionized water and then with isopropyl alcohol (IPA). After nitrogen drying the treated micro-slide, 0.5 ml of a silane solution was uniformly deposited on the treated micro-slide supporting surface. This silane solution comprised 10 weight % of (3-mercaptopropyl)trimethoxysilane (MPTS, obtained from Sigma-Aldrich Company) in a mixture of ethanol and deionized water in a 1:1 molar ratio. After 1 minute of supporting surface contact with the MPTS solution, the micro-slide was spun at 2500 rpm for 30 seconds, followed by annealing at 65° C. for 10 minutes, rinsing with IPA, and drying with nitrogen to obtain a silanized supporting surface on the micro-slide.

Methacrylic acid (MAA) was used for providing hydrophilic areas on the silanized supporting surface. Stearyl methacrylate (SMA) was used for providing the hydrophobic areas on the silanized supporting surface in the following manner.

To achieve a chemically patterned surface having both hydrophilic and hydrophobic regions on the supporting surface, a 0.5 ml of the MAA solution was uniformly spread on the silanized supporting surface, followed by exposing to ultraviolet (UV) radiation through a mask using a Newport accessory having a 260-320 nm filter. The micro-slide was then rinsed with IPA to remove unreacted MAA and air-dried at ambient temperature. In the above UV exposure, it was assumed that the MAA hydrophilic reactants were exclusive to the unmasked regions.

The micro-slide was then subjected to a mask-free (uniform or blanket) UV exposure (using the 260-320 nm filter) after uniformly spreading of 0.5 ml of the SMA reagent on the entire supporting surface, followed by rinsing with acetone, and air-drying at ambient temperature to provide a modifier supporting surface with hydrophilic and hydrophobic regions.

It was determined that the static contact angle difference between the hydrophilic regions and hydrophobic regions was 70°.

A dispersion ("composition") of silver nanoparticles at 70 weight % was coated onto the modified supporting surface of the micro-slide (article) using a syringe coater that provided a wet coverage of 0.5 cm$^3$/cm$^2$ of this composition.

The invention has been described in detail with particular reference to certain preferred embodiments thereof, but it will be understood that variations and modifications can be effected within the spirit and scope of the invention.

The invention claimed is:

1. A method for providing an article, the method comprising, in order:
   providing an inert substrate having first and opposing second supporting surfaces, and the inert substrate having on the first supporting surface thereof, a reactive silane material comprising a head silane component attached to the first supporting surface, and a reactive tail component comprising a reactive moiety selected from the group consisting of a thiol moiety, an ene moiety, an yne moiety, an azide moiety, and a tetrazolyl moiety;
   forming a reactive surface by contacting the reactive silane material on the first supporting surface with a solution comprising a first corresponding reactant capable of reaction with the reactive moiety;
   imagewise UV exposing the reactive surface to cause imagewise reaction of the reactive moiety with the first corresponding reactant, forming reacted regions and latent reaction regions on the reactive surface, the reacted regions comprising a first reaction product of the reactive moiety with the first corresponding reactant, the first reaction product being absent in the latent reaction regions on the reactive surface;
   rinsing away non-reacted first corresponding reactant;
   contacting the reactive surface having both reacted regions and latent reaction regions with a second corresponding reactant that is capable of reaction with the reactive moiety, and subsequently or simultaneously UV exposing the reactive surface to form a second reaction product of the reactive moiety with the second corresponding reactant only in the latent reaction regions;
   rinsing away non-reacted second corresponding reactant to form a modified first supporting surface on the inert substrate, which modified first supporting surface has first regions comprising exclusively the first reaction product and second regions comprising exclusively the second reaction product, wherein the first and second regions have static contact angles that differ by at least 10 degrees and up to and including 110 degrees; and
   providing a composition on the modified first supporting surface, which composition is exclusively attracted to either the first regions or the second regions, but not to both the first and second regions, on the modified first supporting surface.

2. The method of claim 1, wherein the first and second regions have static contact angles that differ by at least 30 degrees and up to and including 80 degrees.

3. The method of claim 1, wherein the first and second regions have static contact angles that differ by at least 35 degrees and up to and including 75 degrees.

4. The method of claim 1, wherein the reactive moiety is an ene moiety, and the first corresponding reactant is a thiol moiety, and the second corresponding reactant is a thiol moiety or a tetrazole moiety.

5. The method of claim 1, wherein the composition comprises seed metal catalysts, and the method further comprises electrolessly plating the composition on the modified first supporting surface.

6. The method of claim 1, wherein the composition is provided on the modified first supporting surface in a pattern, and the method further comprises:
   patternwise transferring the composition from the modified first supporting surface to a receiver material, to form an imaged pattern corresponding to either the first regions or the second regions, but not to both the first and second regions, on the receiver material.

7. The method of claim 1, wherein the composition provided on the modified first supporting surface has a viscosity of at least 1 centipoise (0.001 Pascal sec) and up to and including 300 centipoise (0.3 Pascal sec).

8. The method of claim 1, wherein the composition is provided on the modified first supporting surface at a coverage of at least 5 g/m$^2$ and up to and including 200 g/m$^2$.

9. The method of claim 1, wherein the inert substrate comprises a flexible glass.

10. The method of claim 1, wherein forming the reactive surface and imagewise UV exposing the reactive surface are carried out sequentially.

11. The method of claim 1, for providing the modified first supporting surface having hydrophilic regions and hydrophobic regions on the inert substrate.

12. The method of claim 1, wherein the inert substrate is transparent.

13. The method of claim 12, wherein the imagewise UV exposing is carried out through the opposing second supporting surface of the inert substrate.

* * * * *